(12) United States Patent
Tsuyutani et al.

(10) Patent No.: US 8,779,299 B2
(45) Date of Patent: Jul. 15, 2014

(54) ELECTRONIC COMPONENT-EMBEDED BOARD AND METHOD FOR MANUFACTURING THE SAME

(75) Inventors: Kazutoshi Tsuyutani, Tokyo (JP); Yoshihiro Suzuki, Tokyo (JP)

(73) Assignee: TDK Corporation, Tokyo (JP)

( * ) Notice: Subject to any disclaimer, the term of this patent is extended or adjusted under 35 U.S.C. 154(b) by 307 days.

(21) Appl. No.: 13/428,764

(22) Filed: Mar. 23, 2012

(65) Prior Publication Data

US 2012/0247819 A1    Oct. 4, 2012

(30) Foreign Application Priority Data

Mar. 31, 2011    (JP) ................................. 2011-078470

(51) Int. Cl.
| | |
|---|---|
| *H05K 1/16* | (2006.01) |
| *H05K 1/18* | (2006.01) |
| *H01L 23/485* | (2006.01) |
| *H05K 3/32* | (2006.01) |

(52) U.S. Cl.
CPC .............. *H05K 1/185* (2013.01); *H01L 23/485* (2013.01); *H05K 3/32* (2013.01)
USPC .......................................... 174/260; 361/761

(58) Field of Classification Search
CPC ...... H01L 23/485; H05K 1/181; H05K 1/183; H05K 1/185; H05K 3/30; H05K 3/32
USPC ............................. 174/250, 260; 361/761–764
See application file for complete search history.

(56) References Cited

U.S. PATENT DOCUMENTS

| | | | |
|---|---|---|---|
| 7,420,128 B2* | 9/2008 | Sunohara et al. | ............. 174/260 |
| 2006/0057341 A1 | 3/2006 | Kawabata et al. | |
| 2006/0073639 A1* | 4/2006 | Sunohara et al. | ............. 438/118 |
| 2009/0200658 A1* | 8/2009 | Hsu et al. | ...................... 257/700 |
| 2010/0126758 A1 | 5/2010 | Akai et al. | |

FOREIGN PATENT DOCUMENTS

| | | |
|---|---|---|
| JP | A-2006-086341 | 3/2006 |
| JP | A-2008-288607 | 11/2008 |
| WO | WO 2010/038531 A1 | 4/2010 |

* cited by examiner

*Primary Examiner* — Jeremy C Norris
(74) *Attorney, Agent, or Firm* — Oliff PLC

(57) ABSTRACT

An electronic component or the like is mounted on a substrate, and on the electronic component, an insulating layer is provided. Afterward, via-holes V are made in the insulating layer on terminals of the electronic component. Each of the terminals of the electronic component has, for example, a laminate structure of a first metal layer, a second metal layer and a third metal layer. When the via-holes V are formed, part of the third metal layer having a comparatively high electric resistance is removed, and the corresponding portion is connected to a wiring layer including via-conductors. Moreover, the third metal layer excellent in close contact properties with the insulating layer is preferably used.

18 Claims, 10 Drawing Sheets

ELECTRONIC COMPONENT-EMBEDED BOARD AND METHOD FOR MANUFACTURING THE SAME

BACKGROUND OF THE INVENTION

1. Field of the Invention

The present invention relates to an electronic component-embedded board, and a method for manufacturing the electronic component-embedded board.

2. Description of the Related Art

In recent years, further miniaturization, thinning, high-density mounting of an electronic apparatus have been demanded. Further miniaturization and thinning have also earnestly been demanded for a circuit board module on which there are mounted electronic components including active components such as a semiconductor device constituted of an IC chip for use in the electronic apparatus, passive components such as a condenser (a capacitor), an inductor (a coil), a thermistor and a resistor, and the like. In recent years, to meet such demands for the miniaturization and thinning, there has been suggested an electronic component-embedded board having a high-density mounting structure where the electronic component is included in the board.

Such an electronic component-embedded board is formed, for example, by including the electronic component in an insulating layer made of a resin or a resin composition, making connection holes such as a via-hole and a hole for a plug in the insulating layer on terminals of the electronic component through laser processing or blast processing to expose terminal conductors, and subjecting even the interiors of the connection holes to metal plating or the like, to connect the terminals of the electronic component to a wiring line (a pattern) via the insulating layer.

In this case, various structures of the terminals have been investigated to suitably connect the terminal conductors of the electronic component to wire conductors. For example, Japanese Patent Laid-Open No. 2008-288607 discloses an electronic component-mounting structure including an electronic component in which each of connection pads is constituted of one of an Al film/Ni film/Cu film, an Al film/Ni film/Au film, an Al film/Ni film/Cu film/Au film, an Al film/Ni film/Ag film, an Al film/Cr film/Cu film, an Al film/conductive paste film, an Al film/Ti film/conductive paste film, an Al film/Cr film/conductive paste film, and an Al film/Ti film/Cu film (all is a laminating order from a lower layer), for the purpose of preventing Al from being etched through laser processing, and preventing the connection pads or a semiconductor device itself from being damaged, when the connection pads (terminals) of the semiconductor device are Al.

SUMMARY OF THE INVENTION

However, in the above conventional electronic component-mounting structure, an etching rate of an upper-layer film (a film on an Al film) of each connection pad in laser processing is smaller than that of the Al film. Therefore, the upper-layer film functions as an etching stopper. However, the present inventors have performed investigations in detail, and it has been found that an electric resistance in a connecting portion between the upper-layer film and each wire conductor might disadvantageously increase to deteriorate conductive characteristics. In particular, in an electronic component-embedded board having a highly integrated fine structure, even slight lowering of the conductive characteristics of the electronic component is unfavorable from the viewpoint of performance enhancement of the whole device. Additionally, in the technology disclosed in Japanese Patent Laid-Open No. 2008-288607, it has been suggested that a film thickness of the upper-layer film is made as large as possible and a pad area is made as large as possible (refer to paragraph 0015 of Japanese Patent Laid-Open No. 2008-288607). In this case, it is considered that the conductive characteristics further remarkably deteriorate.

Thus, the present invention has been developed in view of such situations, and an object thereof is to provide an electronic component-embedded board, which can effectively prevent damages of the electronic component, and the generation of a defect or the lowering of a yield due to the damages and which can simultaneously alleviate an electric resistance in a connecting portion between each of terminals of the electronic component and a wiring line to improve conductive characteristics and which can further enhance close contact properties between each IC terminal and a resin insulating layer, and to provide a method for manufacturing the electronic component-embedded board.

To solve the above problem, the present inventors have paid attention to relations between a structure, a material or the like of terminals such as connection pads in an electronic component and electric connection properties or mechanical bonding properties after wiring. The present inventors have intensively repeated researches to complete the present invention.

That is, an electronic component-embedded board according to the present invention comprises a substrate; the electronic component having terminals (external terminals for external connection) and mounted on the substrate; an insulating layer formed so as to cover the electronic component; and a wiring layer electrically connected to the terminals of the electronic component, wherein each of the terminals of the electronic component has a plurality of metal layers, the plurality of metal layers include at least two layers of an outermost surface layer and a connection layer positioned on a lower layer side than the outermost surface layer, the outermost surface layer has a higher electric resistance than the connection layer or the wiring layer, the outermost surface layer is formed in a portion which comes in contact with the insulating layer, the insulating layer is directly bonded to the outermost surface layer, the outermost surface layer is not formed in a portion which comes in contact with the wiring layer, and the wiring layer is electrically connected to the connection layer via no outermost surface layer.

It is to be noted that in the present description, "the electronic component-embedded board" includes not only an individual board (an individual piece or an individual article) which is a unit board including the electronic component therein but also a set board (a work board or a work sheet) including a plurality of individual boards. Moreover, there are not any special restrictions on a type of "the electronic component", and examples of the electronic component include active elements, for example, digital ICs such as a central processing unit (CPU) and a digital signal processor (DSP) having a very high operation frequency, memory system ICs such as an F-Rom and an SDRAM, and analog ICs such as a high-frequency amplifier, an antenna switch and a high-frequency oscillation circuit; and passive elements, for example, a varistor, a resistor and a capacitor. Furthermore, the insulating layer and/or the wiring layer in the electronic component-embedded board is not limited to a single layer. Needless to say, the electronic component-embedded board may include a so-called multilayer structure in which a plurality of insulating layers and wiring layers are laminated. Moreover, a plurality of metal layers may include any type of laminate structure as long as the structure is a multilayer structure in which an outermost surface layer is disposed on an outermost surface and a connection layer is laminated on a lower layer side than the outermost surface layer. For example, in addition to a configuration where the outermost surface layer directly comes in contact with the connection layer and the layers are laminated, a configuration where the outermost surface layer and the connection layer are laminated via an intermediate layer (another metal layer) is included.

In the electronic component-embedded board of the above constitution, the outermost surface layer is not formed in the portion which comes in contact with the wiring layer, and hence the terminals (the connection layer) are directly electrically connected to the wiring layer, via no outermost surface layer having a comparatively high electric resistance. In consequence, the increase of the electric resistance in a connecting portion between each of the terminals of the electronic component and the wiring layer is prevented. On the other hand, the outermost surface layer is formed in the portion which comes in contact with the insulating layer, and the outermost surface layer is directly bonded to the insulating layer. Therefore, when the outermost surface layer excellent in close contact properties as compared with the connection layer is employed, close contact properties between each of the terminals (terminal portions) of the electronic component and the insulating layer can significantly be enhanced as compared with a configuration where the insulating layer is bonded to the connection layer.

Further from the viewpoint of more securely preventing the damages of the connection layer in the terminals of the electronic component, each of the terminals of the electronic component preferably comprises, between the connection layer and the outermost surface layer, for example, a metal layer (an etching stopper layer) which functions as a stopper for an etching treatment or a blast treatment. Here, the etching stopper layer preferably has a lower electric resistance than the outermost surface layer. Examples of a metal constituting the etching stopper layer can include Ni. When the configuration including the etching stopper layer between the outermost surface layer and the connection layer is employed in this manner, in an opening forming step, the wiring layer is connected to the etching stopper layer, and the wiring layer is preferably electrically connected to the connection layer via no outermost surface layer. When such a connection system is employed, it is possible not only to prevent the increase of the electric resistance but also to more securely prevent the damages of the connection layer when the etching treatment or the blast treatment is carried out.

More specifically, when the outermost surface layer of each of the terminals of the electronic component comprises Pd and/or Au (a metal, an alloy or a composite metal is included), the close contact properties between the terminal and the insulating layer can further suitably be enhanced. Moreover, when the connection layer of each of the terminals of the electronic component comprises Al, Cu and/or an alloy of these metals (the metal, the alloy or the composite metal is included), the increase of the electric resistance in the connecting portion between the terminal of the electronic component and the wiring layer can further suitably be suppressed.

Moreover, a method for manufacturing an electronic component-embedded board according to the present invention can effectively prepare the above electronic component-embedded board of the present invention. The method comprises a mounting step of mounting the electronic component having terminals (external terminals for external connection) on a suitable substrate of, for example, a resin or the like; an insulating layer forming step of curing, for example, an uncured resin layer to form an insulating layer so as to cover the electronic component; an opening forming step of forming an opening in the insulating layer so as to expose part of the terminals of the electronic component; and a wiring layer forming step of forming a wiring layer in at least the opening so as to electrically connect the terminals of the electronic component to the wiring layer. Each of the terminals includes a plurality of metal layers, and the plurality of metal layers include at least two layers of an outermost surface layer and a connection layer positioned on a lower layer side than the outermost surface layer. The outermost surface layer has a higher electric resistance than the connection layer or the wiring layer. The opening forming step is characterized in that at least a part of the outermost surface layer of each of the terminals is removed, and the wiring layer is electrically connected to the connection layer via no outermost surface layer. In the electronic component-embedded board obtained by such a method, the electronic component is disposed in the insulating layer so that the electronic component is mounted on the substrate in a so-called face-up state. Terminal portions of the electronic component are fixed in a state where part of the terminals of the electronic component is connected to the wiring layer, and the remaining portions (the other portions) are bonded to the insulating layer. Here, when the opening is formed, at least a part of the outermost surface layer of each of the terminals is removed, and the wiring layer is electrically connected to the connection layer, via no outermost surface layer having a comparatively high electric resistance. In consequence, the increase of the electric resistance in a connecting portion between each terminal of the electronic component and the wiring layer is prevented. Moreover, when the insulating layer is processed to form the opening and the outermost surface layer is removed, the connection layer in each of the terminals of the electronic component is prevented from being damaged. In addition, the outermost surface layer excellent in close contact properties as compared with the connection layer is employed, and hence the close contact properties between each of the terminals (the terminal portions) of the electronic component and the insulating layer can significantly be enhanced as compared with a configuration where the insulating layer is bonded to the connection layer.

It is to be noted that there are not any special restrictions on a treatment (processing means) to form the opening in the opening forming step, and a known technique can suitably be applied. Specifically, examples of the treatment can include a blast treatment and a laser treatment. In these examples, a wet blast treatment is suitable from the viewpoint of preventing electrification caused by static electricity which might be generated when the opening is formed in the insulating layer, to protect the electronic component.

According to an electronic component-embedded board and a method for manufacturing the electronic component-embedded board of the present invention, a wiring layer is connected to a connection layer positioned on a lower layer side than the wiring layer and having a comparatively low electric resistance, via no outermost surface layer having a comparatively high electric resistance. Therefore, the increase of the electric resistance of the corresponding portion can be suppressed. Furthermore, when an opening is processed and formed in the insulating layer, the lower layer-side connection layer in each of terminals of an electronic component is protected by the outermost surface layer, and the damages of the connection layer are prevented. Moreover, when the outermost surface layer excellent in close contact properties with the insulating layer is employed, the close contact properties between each of the terminals (terminal portions) of the electronic component and the insulating layer can significantly be enhanced as compared with a configuration where the insulating layer is bonded to the connection layer. In consequence, it is possible to effectively prevent the generation of a defect of the electronic component-embedded board or the lowering of a yield due to the peeling of the electronic component from the insulating layer and the damages of the terminals. Moreover, the electric resistance in a connecting portion between each terminal conductor of the electronic component and each wire conductor can be decreased to enhance conductive characteristics.

DESCRIPTION OF THE PREFERRED EMBODIMENTS

Figure 1:
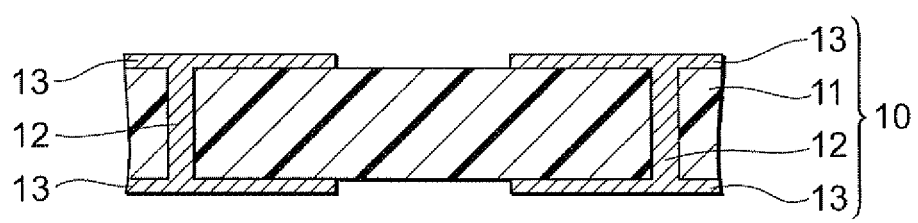
FIG. 1 is a flow diagram showing a state where an electronic component-embedded board is manufactured according to an embodiment of the present invention.

Hereinafter, embodiments of the present invention will be described in detail. It is to be noted that upper, lower, left and right positional relations and the like are based on positional relations shown in the drawings, unless otherwise specified. Moreover, dimensional ratios of the drawings are not limited to shown ratios. Furthermore, the following embodiments are illustrations for explaining the present invention, and the present invention is not limited only to the embodiments. In addition, the present invention can variously be modified without departing from the scope.

Figure 6:
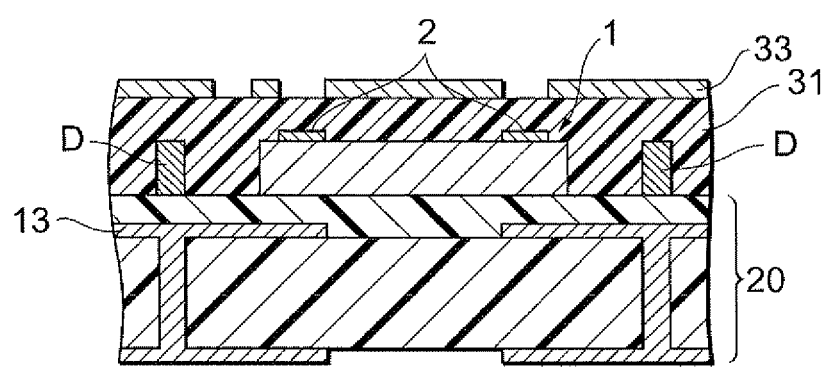
FIG. 6 is a flow diagram showing a state where the electronic component-embedded board is manufactured according to the embodiment of the present invention.
Figure 7:
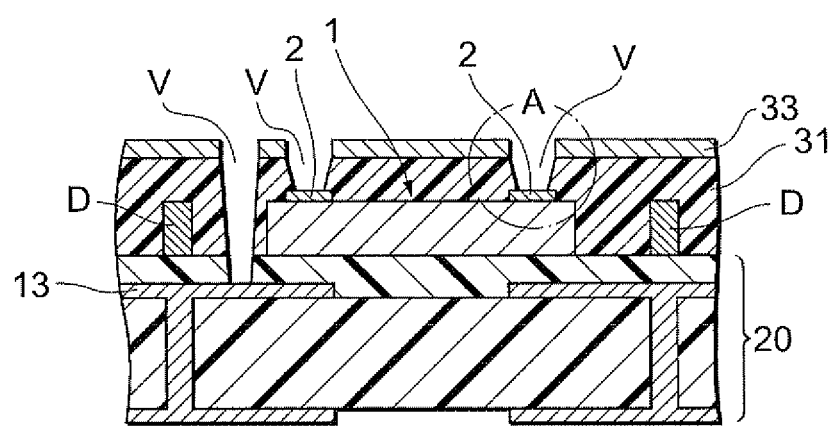
FIG. 7 is a flow diagram showing a state where the electronic component-embedded board is manufactured according to the embodiment of the present invention.
Figure 8:
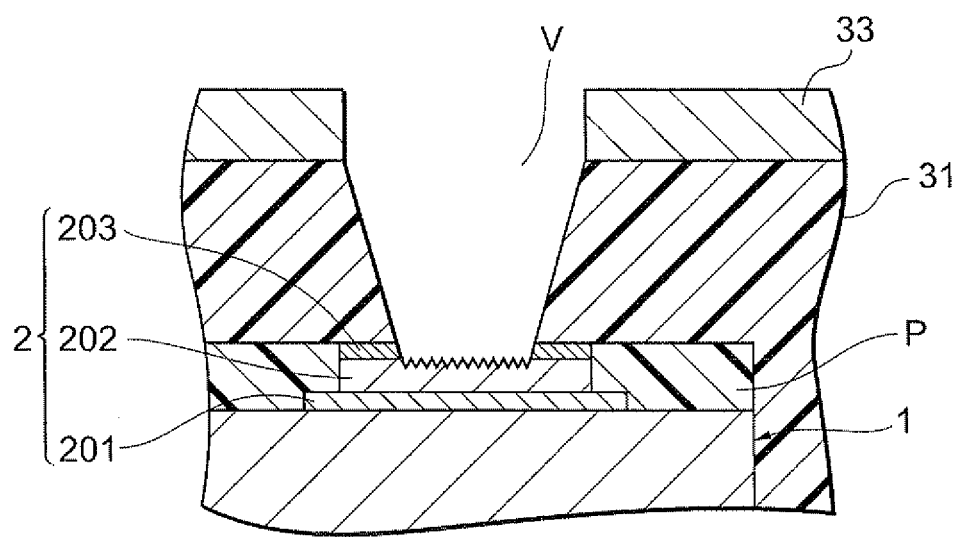
FIG. 8 is a flow diagram showing a state where the electronic component-embedded board is manufactured according to the embodiment of the present invention, and an enlarged schematic view of A part of FIG. 7.

FIG. 1 to FIG. 10 are process flow diagram (main part enlarged sectional views) showing states where an electronic component-embedded board of the present invention is manufactured according to a suitable embodiment of a method for manufacturing the electronic component-embedded board according to the present invention. Specifically, the process flow diagrams show, as a work board, an example of a manufacturing procedure of a multilayer printed board in which a plurality of electronic components are included. It is to be noted that FIG. 8 is an enlarged schematic view of A part in FIG. 7.

Figure 2:
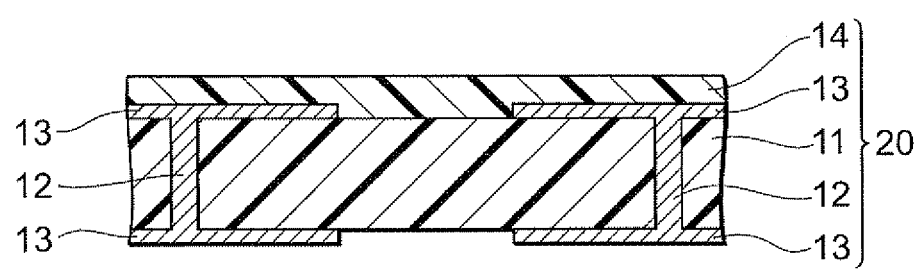
FIG. 2 is a flow diagram showing a state where the electronic component-embedded board is manufactured according to the embodiment of the present invention.

Here, there is first prepared a base material (a work board) formed by attaching metal films such as Cu foils to both surfaces of an insulating layer 11 made of, for example, glass epoxy, i.e., copper clad laminates (CCL) on both surfaces. Next, via-holes are made in the layer by a drill or laser, and further electroless plating and electrolytic plating are carried out. Afterward, a metal layer is patterned by a known method, to obtain a base material 10 in which via-conductors 12 are formed in the insulating layer 11, and wiring layers (patterns) 13 are formed on both surfaces of the insulating layer 11 (FIG. 1). Furthermore, for example, a resin sheet or the like is laminated on one surface of the base material 10 by vacuum pressing or the like, to obtain a substrate 20 in which a further insulating layer 14 is formed on the wiring layer 13 (FIG. 2). In this manner, the substrate 20 has a resin coated copper (RCC) structure.

It is to be noted that there are not any special restrictions on a material of the wiring layer 13. In addition to the above Cu, examples of the material include metal conductive materials such as Au, Ag, Ni, Pd, Sn, Cr, Al, W, Fe, Ti, and SUS materials. Among these materials, Cu or the like is preferable from the viewpoints of conductivity and cost (this also applies to another wiring layer).

Moreover, there are not any special restrictions on a material for use in the insulating layer 11. Any material can be used as long as the material can be formed in a sheet-like or film-like shape. In addition to the above glass epoxy, examples of the material include vinyl benzyl resin, polyvinyl benzyl ether compound resin, bismaleimide triazine resin (BT resin), polyphenylether (polyphenylene ether oxide) resin (PPE or PPO), cyanate ester resin, epoxy+active ester curable resin, polyphenylene ether resin (polyphenylene oxide resin), curable polyolefin resin, benzocyclobutene resin, polyimide resin, aromatic polyester resin, aromatic liquid crystal polyester resin, polyphenylene sulfide resin, polyether imide resin, polyacrylate resin, polyether ether ketone resin, fluororesin, epoxy resin, phenol resin, and benzoxazine resin; materials formed by adding, to these resins, silica, talc, calcium carbonate, magnesium carbonate, aluminum hydroxide, magnesium hydroxide, aluminum borate whisker, potassium titanate fiber, alumina, glass flake, glass fiber, tantalum nitride, and aluminum nitride; materials formed by adding, to these resins, metal oxide powder including at least one metal of magnesium, silicon, titanium, zinc, calcium, strontium, zirconium, tin, neodymium, samarium, aluminum, bismuth, lead, lanthanum, lithium, and tantalum; materials formed by blending these resins with resin fiber such as glass fiber and aramid fiber; and materials formed by impregnating these resins with glass cloth, aramid fiber, and nonwoven cloth. The material can suitably be selected and used from the viewpoints of electric properties, mechanical properties, water absorption, reflow resistance and the like.

Figure 3:
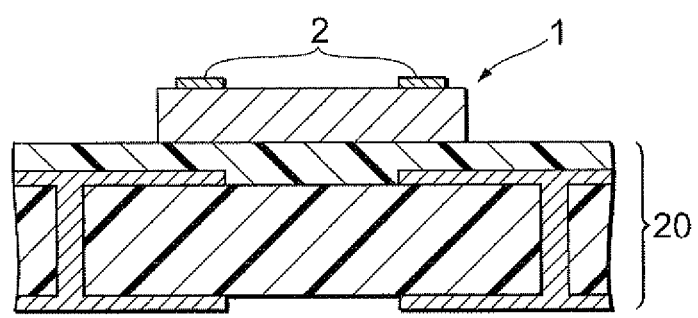
FIG. 3 is a flow diagram showing a state where the electronic component-embedded board is manufactured according to the embodiment of the present invention.

Next, an electronic component 1 is mounted on the insulating layer 14 (FIG. 3: a mounting step). The electronic component 1 is, for example, a semiconductor IC having a bare chip state (the bare chip: a die), and includes a large number of terminals (electrodes) 2 on a substantially rectangular plate-like main surface. It is to be noted that the view shows only two terminal electrodes 2, and the other terminal electrodes are omitted. Moreover, the terminals 2 and a peripheral structure thereof will be described later.

Furthermore, the back surface of the electronic component 1 is polished, whereby a thickness of the electronic component 1 is smaller as compared with a usual semiconductor IC.

Specifically, the thickness of the electronic component 1 is, for example, 200 μm or smaller, and further preferably from about 50 to 100 μm. In this case, the back surface polishing treatment of the electronic component 1 is collectively performed on a large number of electronic components 1 in a wafer state at the time of forming. Afterward, individual electronic components 1 are preferably separated by dicing. As another method, when the wafer is cut and separated or half cut into the individual electronic components 1 by the dicing prior to decreasing the thickness by the polishing treatment, the back surface of the electronic component 1 can be polished in a state where the main surface of the electronic component 1 is covered with a thermosetting resin or the like. Furthermore, the back surface of the electronic component 1 is preferably subjected to a rough surface forming treatment by etching, a plasma treatment, a laser treatment, blast polishing, buff polishing, a chemical treatment or the like, to enhance film thinning or close contact properties.

Figure 4:
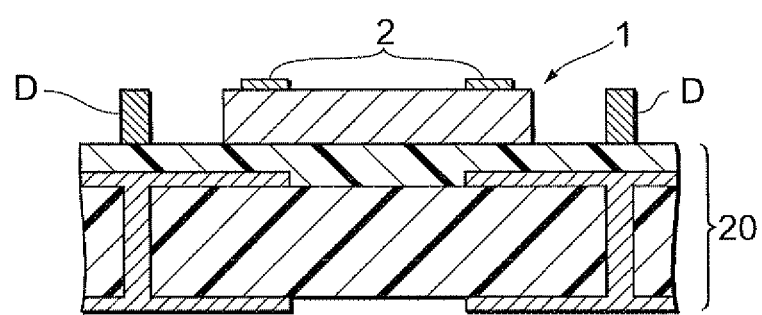
FIG. 4 is a flow diagram showing a state where the electronic component-embedded board is manufactured according to the embodiment of the present invention.

Moreover, in a step of forming an insulating layer on the electronic component 1 as described later, a resin of an outer peripheral portion of the substrate 20 protrudes from the substrate 20. In this case, a warp might occur in the whole substrate 20 (the work board) because the thickness of the insulating layer decreases. Moreover, also when a mounting position of the electronic component 1 on the substrate 20 locally shifts, the warp of the substrate 20 might similarly occur. Therefore, to achieve the uniform thickness of the insulating layer and suppress the warp, a so-called dummy material D may be mounted at the same level as the electronic component 1 (FIG. 4). In this case, the dummy material D may be mounted on the substrate 20 prior to mounting the electronic component 1, or simultaneously with the mounting of the electronic component 1.

As the usable dummy material D, a material can especially limitlessly be used as long as the material satisfies the following formulas (1) and (2), $$\alpha 1 \leq \alpha 3 \quad (1); \text{ and}$$

$$\alpha 2 \leq \alpha 3 \quad (2),$$

in which α1 is a linear expansion coefficient (ppm/K) of the electronic component 1, α2 is a linear expansion coefficient (ppm/K) of the dummy material D, and α3 is a linear expansion coefficient (ppm/K) of each wiring layer or each insulating layer.

For example, in the electronic component, the substrate, the wiring layer and the insulating layer for use in this type of use application, usually α1 is from about 1 to 8 (ppm/K), and α3 is from about 14 to 20 (ppm/K). Therefore, α2 is preferably from 3 to 16 (ppm/K). More specifically, examples of the dummy material D include a metal, an alloy, a resin or the like having a linear expansion coefficient of 3 to 16 (ppm/K). For example, SUS430 (a linear expansion coefficient: 10.5 (ppm/K)) can preferably be used.

Figure 5:
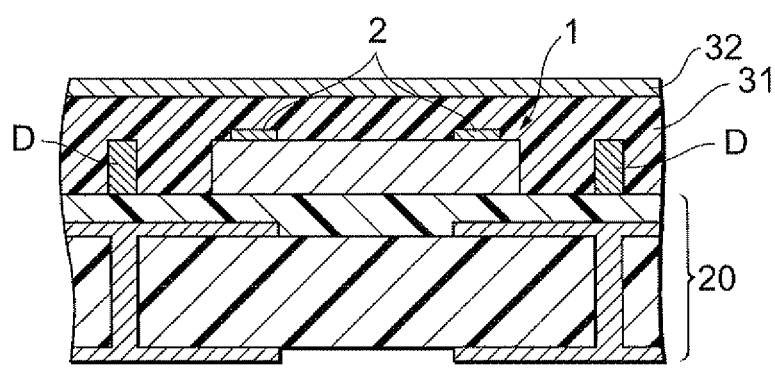
FIG. 5 is a flow diagram showing a state where the electronic component-embedded board is manufactured according to the embodiment of the present invention.

Then, on the substrate 20 on which the electronic component 1 and the dummy material D are arranged in parallel, an insulating layer 31 and a conductor layer 32 are formed so as to cover the electronic component 1 and the dummy material D (FIG. 5: an insulating layer forming step). Furthermore, part of the conductor layer 32 is etched and removed, to form a conductor mask 33 (becomes part of a conductor layer 41 and a wiring layer 43 as described later) having a required conductor pattern (FIG. 6). In this case, the insulating layer 31 is formed, for example, by coating the layer with an uncured or half-cured thermosetting resin. Afterward, the uncured resin is heated and half cured. Then, the resin is preferably cured and formed together with the conductor layer 32 by use of pressing means. In this case, close contact properties of the conductor layer 32, the insulating layer 31, the electronic component 1 and the dummy material D are enhanced, respectively.

Next, the insulating layer 31 exposed from the opening pattern of the conductor mask 33 which has not removed by the etching is cut by a known blast treatment, and via-holes V (openings) are formed on the terminals 2 of the electronic component 1 and on part of the wiring layer 13 on one surface side of the substrate 20 (FIG. 7: an opening forming step). In consequence, the terminals 2 of the electronic component 1 and part of the wiring layer 13 of the substrate 20 are exposed in the via-holes V. It is to be noted that the via-hole V extending through the insulating layer 31 to open in the wiring layer 13 of the substrate 20 functions as an inner via-hole. It is to be noted that there are not any special restrictions on a type of the blast treatment. However, from the viewpoint of preventing electrification from being caused by electrostatic electricity which might be generated when the via-holes V are made in the insulating layer 31 to protect the electronic component 1, a wet blast treatment is preferable.

Here, as described above, FIG. 8 is an enlarged schematic view of the A part of FIG. 7. In the view, a passivation film P is formed on the main surface of the electronic component 1. There are not any special restrictions on a material of the passivation film P, as long as the material is a non-conductive material.

Moreover, each of the terminals 2 of the electronic component 1 have a structure where a plurality of metal layers are laminated. That is, the terminal 2 has a structure where on Al and/or Cu which is a pad electrode of the electronic component 1 in a bare chip state or a first metal layer 201 (a connection layer) containing the metal, for example, a second metal layer 202 (an etching stopper layer) and a third metal layer 203 (an outermost surface layer) collectively formed in a wafer state when the electronic component 1 is formed and having a conductivity are laminated in this order. In the present embodiment, the third metal layer 203 (the outermost surface layer) having a high electric resistance than the first metal layer 201 (the connection layer) and the second metal layer 202 (an etching stopper layer) is employed. The second metal layer 202 and the third metal layer 203 can be formed, for example, by electroless (substitution) plating, electrolytic plating, evaporation by sputtering, printing of a solder paste, printing of a nano-paste, or a suitable combination thereof. A total film thickness of these layers is, for example, preferably from about 1 to 10 μm. Moreover, the thickness over the upper surface of the passivation film P is preferable.

Specifically, suitable examples of such a structure of each of the terminals 2 including the first metal layer 201, the second metal layer 202 and the third metal layer 203 in this order (it is to be noted that each of the layers may have a laminate structure of a plurality of layers) include Al/Ni/Pd, Al/Ni/Au, Al/Ni/Pd/Au, Cu/Ni/Pd, Cu/Ni/Au, Cu/Ni/Pd/Au, Al/Cu/Ni/Pd, Al/Cu/Ni/Au, Al/Cu/Ni/Pd/Au. Note that in the above-mentioned combinations, each metal element represents a main component in the metal layer 201, 202, and 203, and thus the metal layer 201, 202, and 203 are not limited to a metal layer consisting solely of the indicated metal in the above-mentioned combinations and a metal layer consisting solely of a single alloy of the indicated metal in the above-mentioned combinations. Among these examples, it is considered that the thin films can collectively and directly be formed without requiring any masks, and close contact properties with the insulating layer 31, an etching resistance as an etching stopper and electric connection properties with the wiring layer are taken into consideration. In this case, on the first metal layer 201 which is the pad electrode of the electronic component 1, an Ni/Pd film and an Ni/Au film or a laminate film of an alloy or a composite metal containing at least one of the metals are preferably formed as the second metal layer 202 and the third metal layer 203 by use of the electroless plating.

Description will be made in more detail. When close contact properties between the outermost surface layer metal of each of the terminals 2 of the electronic component 1 and the material for use in the insulating layer 31 are poor, a pretreatment liquid is entered into the interface between the outermost surface layer of the terminal 2 and the insulating layer 31 in a pretreatment prior to the plating treatment when a via-conductor is formed in each of the via-holes V as described later. Owing to the corrosion of the terminal 2 which might be caused by the entering of the liquid, a wiring resistance becomes high to a disadvantageous degree. In the worst case, disconnection or a decrease in the insulation properties between the terminals 2 might occur. On the other hand, especially when plated and formed Pd or Au is used as a constitutional metal of the third metal layer 203 which is the outermost surface layer of the terminal 2, it is possible to remarkably enhance the close contact properties with the insulating layer 31.

On the other hand, when a further long-term quality is required, the corrosion of Ni by high-concentration segregation (a black pad) of phosphor (P) is feared in a method of forming films of Ni and Au by the electroless plating, and hence the constitutional metal of the third metal layer 203 is preferably Pd. However, Pd tends to have a higher resistance value, as compared with Cu, Al or the like preferably for use in a wiring line or the like of the electronic component 1. Therefore, as shown in FIG. 8, the third metal layer 203 which is the outermost surface layer having such a comparatively high resistance value is removed when forming and processing the via-holes V. To facilitate this removal, a thickness of the third metal layer 203 is, for example, preferably from about 0.01 to 1 μm. Moreover, a thickness of the second metal layer 202 which is an intermediate layer between the third metal layer 203 as the outermost surface layer and the first metal layer 201 as the pad electrode (the lowermost layer of each of the terminals 2) is, for example, preferably from about 2 to 10 to prevent the pad electrode from being damaged or lost and further to prevent a main body of the electronic component 1 from being damaged when the pad electrode is lost. Furthermore, when it is possible to acquire such a thickness that the first metal layer 201 is not damaged, the second metal layer may be thin, or may be omitted.

Figure 9:
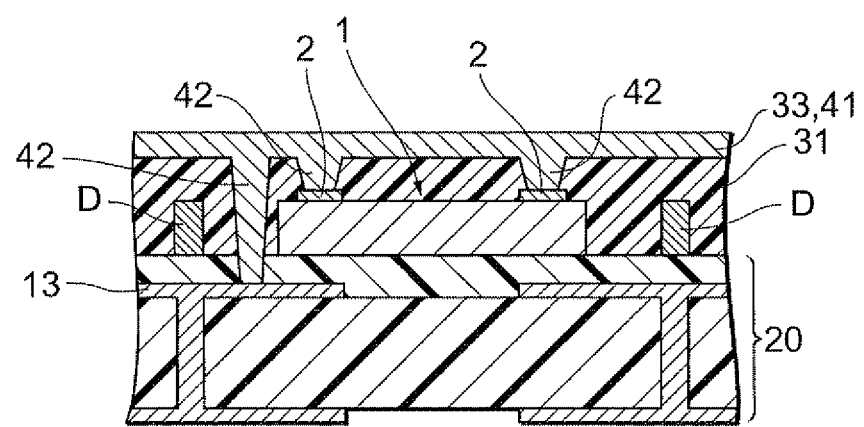
FIG. 9 is a flow diagram showing a state where the electronic component-embedded board is manufactured according to the embodiment of the present invention.
Figure 10:
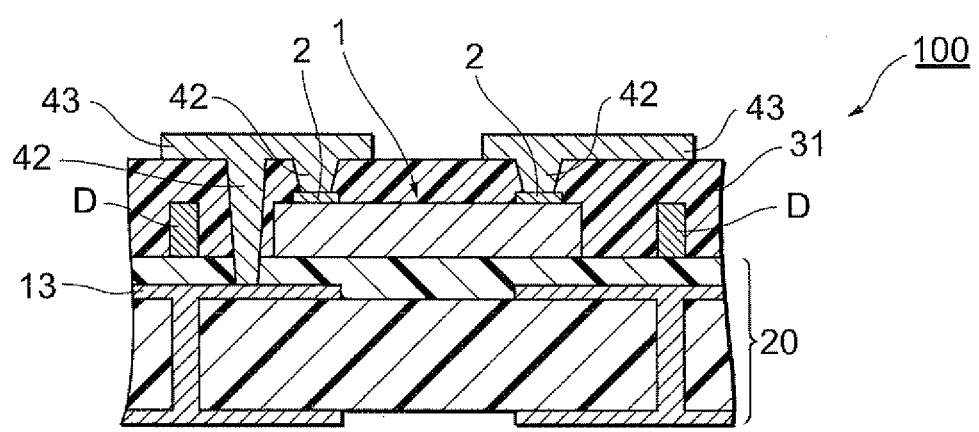
FIG. 10 is a flow diagram showing a state where the electronic component-embedded board is manufactured according to the embodiment of the present invention.

Next, through a suitable pretreatment for the purpose of removing an oxide film of a surface conductor (the second metal layer 202) exposed in the via-hole V, or the like, a wiring conductor is grown by carrying out the electroless plating and the electrolytic plating, so as to cover an inner wall surface and a bottom wall surface of the via-hole V, and the insulating layer 31 and the conductor mask 33. In consequence, the conductor layer 41 is laminated and formed on the conductor mask 33, and via-conductors 42 connecting the terminals 2 of the electronic component 1 to the conductor layer 41 and connecting the wiring layer 13 of the substrate 20 to the conductor layer 41 are formed (FIG. 9). Then, the conductor layer 41 is partially etched to form the wiring layer 43 (the via-conductors 42 become part of the layer) having a desirable pattern, thereby obtaining a electronic component-embedded board 100 of the present invention (FIG. 10: a wiring layer forming step is constituted of processes shown in FIG. 9 and FIG. 10).

According to the electronic component-embedded board and the method for manufacturing the electronic component-embedded board of the present embodiment, the third metal layer 203 (the outermost surface layer) having a higher electric resistance than the first metal layer 201 (the connection layer) or the second metal layer 202 (an etching stopper layer) is employed. However, when each of the via-holes V is formed, part of the third metal layer 203 (the outermost surface layer) is removed, and the second metal layer 202 (an etching stopper layer) is connected to the wiring layer 43. In consequence, the first metal layer 201 (the connection layer) is electrically connected to the wiring layer 43, via no third metal layer 203 (no outermost surface layer). Therefore, it is possible to alleviate an electric resistance in a connecting portion between the terminal 2 of the electronic component 1 and a wiring line such as the wiring layer 43. Conductive characteristics can be improved, and a reliability of a product can be enhanced.

Moreover, as the third metal layer 203 which is the outermost surface layer constituting each of the terminals 2 of the electronic component 1, the layer excellent in close contact properties (bonding properties) with the insulating layer 31 is employed. In a connecting portion between the terminal 2 of the electronic component 1 (the third metal layer 203 which is the outermost surface layer) and the insulating layer 31, close contact between both the layers can be very firm. In consequence, the damages, the disconnection and the like of the terminals 2 can securely be prevented from being generated in a post-treatment. Furthermore, each of the terminals 2 of the electronic component 1 includes the second metal layer 202 functioning as the etching stopper and having a predetermined thickness. Therefore, it is possible to prevent the first metal layer 201 which is the pad electrode of the electronic component 1 from being damaged or lost. Furthermore, it is possible to securely suppress the damages of the electronic component 1. As described above, it is possible to effectively prevent the damages of the electronic component 1, and the generation of a defect and the lowering of a yield due to the damages of the electronic component. Moreover, in a conventional technology, it is presumed that bumps such as stud bumps are formed one by one on the pad electrodes (the first metal layers 201) of the terminals 2 of the electronic component 1, to protect the pad electrodes. However, in this case, much time and cost are required. On the other hand, according to the above embodiments of the present invention, such forming of the conventional bumps is not required, and hence it is possible to further noticeably improve productivity and economical efficiency of the product.

It is to be noted that as described above, the present invention is not limited to the above embodiments, and can variously be modified without changing the scope. For example, when the insulating layer 31 and the conductor layer 32 are formed as shown in FIG. 5, as alternative means of the above embodiment, the only insulating layer 31 may first be formed, and then the conductor layer 32 may be formed by the electroless plating and the electrolytic plating. Moreover, the passivation film P in the electronic component 1 may be omitted from the viewpoints of cost and the like. Furthermore, the second metal layers 202 in the terminals 2 of the electronic component 1 may be omitted. In addition, when the via-holes V are dug and processed, for example, a processing treatment by high-output pulse laser such as carbon dioxide gas laser may be used in place of the blast treatment. Furthermore, for example, the steps shown in FIG. 3 to FIG. 10 are repeated, so that an electronic component-embedded board of a multilayer structure including a plurality of layers can be manufactured.

As described above, according to the electronic component-embedded board and the method for manufacturing the electronic component-embedded board of the present invention, it is possible to enhance productivity, economical efficiency and reliability as compared with a conventional technology. Therefore, the present invention can broadly and effectively be utilized in an electronic component-including apparatus, device and system, various devices, and the like, in which miniaturization and high performance are especially required, and utilized in the manufacturing thereof.

The present application is based on Japanese priority applications No. 2011-078470 filed on Mar. 31, 2011, the entire contents of which are hereby incorporated by reference.

DESCRIPTION OF REFERENCE SIGNS

1 . . . electronic component, 2 . . . terminal electrode, 10 . . . base material, 11 . . . insulating layer, 12 . . . via-conductor, 13 . . . wiring layer, 14 . . . insulating layer, 20 . . . substrate, 31 . . . insulating layer, 32 . . . conductor layer, 33 . . . conductor mask, 41 . . . conductor layer, 42 . . . via-conductor, 43 . . . wiring layer, 100 . . . electronic component-embedded board, 201 . . . first metal layer (connection layer), 202 . . . second metal layer (etching stopper layer), 203 . . . third metal layer (outermost surface layer), D . . . dummy material, V . . . via-hole (opening), and P . . . passivation film.

What is claimed is:

1. An electronic component-embedded board, comprising:
a substrate;
the electronic component having terminals and mounted on the substrate;
an insulating layer formed so as to cover the electronic component; and
a wiring layer electrically connected to the terminals of the electronic component,
wherein each of the terminals of the electronic component has a plurality of metal layers, the plurality of metal layers include at least two layers of an outermost surface layer and a connection layer positioned on a lower layer side than the outermost surface layer, the outermost surface layer has a higher electric resistance than the connection layer or the wiring layer, the outermost surface layer is formed in a portion which comes in contact with the insulating layer, the insulating layer is directly bonded to the outermost surface layer, the outermost surface layer is not formed in a portion which comes in contact with the wiring layer, and the wiring layer is electrically connected to the connection layer via no outermost surface layer.

2. The electronic component-embedded board according to claim 1, wherein the outermost surface layer comprises Pd and/or Au.

3. The electronic component-embedded board according to claim 2,
wherein the connection layer comprises Al, Cu, and/or an alloy of these metals.

4. The electronic component-embedded board according to claim 3,
wherein the terminals of the electronic component comprises an etching stopper layer between the outermost surface layer and the connection layer, and
wherein in the portion which comes in contact with the wiring layer, the wiring layer is connected to the etching stopper layer, and the wiring layer is electrically connected to the connection layer via no outermost surface layer.

5. The electronic component-embedded board according to claim 2,
wherein the terminals of the electronic component comprises an etching stopper layer between the outermost surface layer and the connection layer, and
wherein in the portion which comes in contact with the wiring layer, the wiring layer is connected to the etching stopper layer, and the wiring layer is electrically connected to the connection layer via no outermost surface layer.

6. The electronic component-embedded board according to claim 1,
wherein the connection layer comprises Al, Cu, and/or an alloy of these metals.

7. The electronic component-embedded board according to claim 6,
wherein the terminals of the electronic component comprises an etching stopper layer between the outermost surface layer and the connection layer, and
wherein in the portion which comes in contact with the wiring layer, the wiring layer is connected to the etching stopper layer, and the wiring layer is electrically connected to the connection layer via no outermost surface layer.

8. The electronic component-embedded board according to claim 1,
wherein the terminals of the electronic component comprises an etching stopper layer between the outermost surface layer and the connection layer, and
wherein in the portion which comes in contact with the wiring layer, the wiring layer is connected to the etching stopper layer, and the wiring layer is electrically connected to the connection layer via no outermost surface layer.

9. A method for manufacturing an electronic component-embedded board, comprising:
a mounting step of mounting a electronic component having terminals on a substrate;
an insulating layer forming step of forming an insulating layer so as to cover the electronic component;
an opening forming step of forming an opening in the insulating layer so as to expose part of the terminals of the electronic component; and
a wiring layer forming step of forming a wiring layer in at least the opening so as to electrically connect the terminals of the electronic component to the wiring layer,
wherein each of the terminals has a plurality of metal layers, and the plurality of metal layers include at least two layers of an outermost surface layer and a connection layer positioned on a lower layer side than the outermost surface layer, the outermost surface layer has a higher electric resistance than the connection layer or the wiring layer, and
in the opening forming step, at least a part of the outermost surface layer of each of the terminals is removed, and the wiring layer is electrically connected to the connection layer via no outermost surface layer.

10. The method for manufacturing the electronic component-embedded board according to claim 9,
wherein the outermost surface layer comprises Pd and/or Au.

11. The method for manufacturing the electronic component-embedded board according to claim 10,
wherein the connection layer comprises Al, Cu, and/or an alloy of these metals.

12. The method for manufacturing the electronic component-embedded board according to claim 11, wherein the terminals of the electronic component comprises an etching stopper layer between the outermost surface layer and the connection layer, and wherein in the opening forming step, the wiring layer is connected to the etching stopper layer, and the wiring layer is electrically connected to the connection layer via no outermost surface layer.

13. The method for manufacturing the electronic component-embedded board according to claim 10, wherein the terminals of the electronic component comprises an etching stopper layer between the outermost surface layer and the connection layer, and wherein in the opening forming step, the wiring layer is connected to the etching stopper layer, and the wiring layer is electrically connected to the connection layer via no outermost surface layer.

14. The method for manufacturing the electronic component-embedded board according to claim 9, wherein the connection layer comprises Al, Cu, and/or an alloy of these metals.

15. The method for manufacturing the electronic component-embedded board according to claim 14, wherein the terminals of the electronic component comprises an etching stopper layer between the outermost surface layer and the connection layer, and wherein in the opening forming step, the wiring layer is connected to the etching stopper layer, and the wiring layer is electrically connected to the connection layer via no outermost surface layer.

16. The method for manufacturing the electronic component-embedded board according to claim 9, wherein the terminals of the electronic component comprises an etching stopper layer between the outermost surface layer and the connection layer, and wherein in the opening forming step, the wiring layer is connected to the etching stopper layer, and the wiring layer is electrically connected to the connection layer via no outermost surface layer.

17. The method for manufacturing the electronic component-embedded board according to claims 16, wherein in the opening forming step, the opening is formed by a wet blast treatment.

18. The method for manufacturing the electronic component-embedded board according to claims 9, wherein in the opening forming step, the opening is formed by a wet blast treatment.

* * * * *